(12) United States Patent
Schleicher et al.

(10) Patent No.: US 7,262,635 B2
(45) Date of Patent: Aug. 28, 2007

(54) INTERCONNECTION RESOURCES FOR PROGRAMMABLE LOGIC INTEGRATED CIRCUIT DEVICES

(75) Inventors: James Schleicher, Santa Clara, CA (US); Jim Park, San Jose, CA (US); Sergey Shumarayev, San Leandro, CA (US); Bruce Pedersen, San Jose, CA (US); Tony Ngai, Campbell, CA (US); Wei-Jen Huang, Burlingame, CA (US); Victor Maruri, Mountain View, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/514,692

(22) Filed: Sep. 1, 2006

(65) Prior Publication Data

US 2007/0080710 A1    Apr. 12, 2007

Related U.S. Application Data

(63) Continuation of application No. 11/087,377, filed on Mar. 22, 2005, now Pat. No. 7,123,052, which is a continuation of application No. 10/797,484, filed on Mar. 9, 2004, now Pat. No. 6,897,680, which is a continuation of application No. 10/299,572, filed on Nov. 18, 2002, now Pat. No. 6,727,727, which is a continuation of application No. 10/017,199, filed on Dec. 14, 2001, now Pat. No. 6,525,564, which is a continuation of application No. 09/517,146, filed on Mar. 2, 2000, now Pat. No. 6,366,120.

(60) Provisional application No. 60/142,431, filed on Jul. 6, 1999, provisional application No. 60/122,788, filed on Mar. 4, 1999.

(51) Int. Cl.
    *H03K 19/177* (2006.01)
(52) U.S. Cl. ............................................. 326/41; 326/39
(58) Field of Classification Search ................... 326/41
    See application file for complete search history.

(56) References Cited

U.S. PATENT DOCUMENTS

| 6,798,239 | B2 * | 9/2004 | Douglass et al. | 326/39 |
| 7,071,732 | B1 * | 7/2006 | Jang et al. | 326/41 |
| 2001/0043083 | A1 * | 11/2001 | Cliff et al. | 326/41 |

* cited by examiner

*Primary Examiner*—Vibol Tan
(74) *Attorney, Agent, or Firm*—Fish & Neave, IP Group of Ropes & Gray LLP; Robert R. Jackson; Gall Gotfried

(57) ABSTRACT

A programmable logic device has many regions of programmable logic, together with relatively general-purpose, programmable, interconnection resources that can be used to make interconnections between virtually any of the logic regions. In addition, various types of more local interconnection resources are associated with each logic region for facilitating the making of interconnections between adjacent or nearby logic regions without the need to use the general-purpose interconnection resources for those interconnections. The local interconnection resources support flexible clustering of logic regions via relatively direct and therefore high-speed interconnections, preferably in both horizontal and vertical directions in the typically two-dimensional array of logic regions. The logic region clustering options provided by the local interconnection resources are preferably boundary-less or substantially boundary-less within the array of logic regions.

19 Claims, 9 Drawing Sheets

INTERCONNECTION RESOURCES FOR PROGRAMMABLE LOGIC INTEGRATED CIRCUIT DEVICES

This application is a continuation of U.S. patent application Ser. No. 11/087,377, filed Mar. 22, 2005 (issued as U.S. Pat. No. 7,123,052, Oct. 17, 2006), which is a continuation of U.S. patent application Ser. No. 10/797,484, filed Mar. 9, 2004 (issued as U.S. Pat. No. 6,897,680, May 24, 2005), which is a continuation of U.S. patent application Ser. No. 10/299,572, filed Nov. 18, 2002 (issued as U.S. Pat. No. 6,727,727, Apr. 27, 2004), which is a continuation of U.S. patent application Ser. No. 10/017,199, filed Dec. 14, 2001 (issued as U.S. Pat. No. 6,525,564, Feb. 25, 2003), which is a continuation of U.S. patent application Ser. No. 09/517,146, filed Mar. 2, 2000 (issued as U.S. Pat. No. 6,366,120, Apr. 2, 2002), which claims the benefit U.S. provisional patent application No. 60/122,788, filed Mar. 4, 1999, and U.S. provisional patent application No. 60/142,431, filed Jul. 6, 1999. All of these prior applications are hereby incorporated by reference herein in their entireties.

BACKGROUND OF THE INVENTION

This invention relates to programmable logic array integrated circuit devices ("programmable logic devices" or "PLDs"), and more particularly to interconnection resources for use on programmable logic devices that increase the speed at which those devices can be made to operate.

Programmable logic devices typically include (1) many regions of programmable logic, and (2) programmable interconnection resources for selectively conveying signals to, from, and/or between those logic regions. Each logic region is programmable to perform any of several different, relatively simple logic functions. The interconnection resources are programmable to allow the logic regions to work together to perform much more complex logic functions than can be performed by any individual logic region. Examples of known PLDs are shown in Wahlstrom U.S. Pat. No. 3,473,160, Freeman U.S. Pat. No. Re. 34,363, Cliff et al. U.S. Pat. No. 5,689,195, Cliff et al. U.S. Pat. No. 5,909,126, and Jefferson et al. U.S. patent application Ser. No. 09/266,235, all which are hereby incorporated by reference herein.

A frequent objective in the design of PLDs is to increase the speed at which the device can be operated. The speeds at which signals can travel through the interconnection resources between logic regions is particularly important to determining device speed. Overall, the interconnection resources must have the general-purpose capability of connecting any logic region to any other logic region. But in addition to this, it can be helpful to find ways to make faster interconnections between nearby logic regions. Many complex logic tasks can be broken down into parts, each of which can be performed by a respective cluster of logic regions. By providing interconnection resources that facilitate the flexible formation of clusters of logic regions with high-speed interconnection capabilities among the logic regions in such clusters, the ability of the PLD to perform various complex logic tasks at high speed is enhanced.

In view of the foregoing, it is an object of this invention to provide improved interconnection resources for programmable logic devices.

It is a more particular object of this invention to provide interconnection resources for programmable logic devices that facilitate the formation of extended clusters of nearby logic modules between which high-speed interconnections can be made.

SUMMARY OF THE INVENTION

These and other objects of the invention are accomplished in accordance with the principles of the invention by providing programmable logic devices with interconnection resources that facilitate the provision of interconnections between logic modules in adjacent rows of logic regions, as well as between nearby logic regions in each row. Typically the logic regions on a PLD are arranged in a two-dimensional array of intersecting rows and columns of such regions. Each logic region may include a plurality of subregions. Local feedback conductors may be provided for facilitating communication among the subregions in a region. In addition, these local feedback conductors may be interleaved between horizontally adjacent regions in a row, thereby facilitating high speed interconnection among the subregions of horizontally adjacent regions. In accordance with this invention such high speed local interconnection is additionally provided between adjacent rows in any of several ways. For example, output signals of subregions in each row may be additionally applied substantially directly (i.e., without making use of the more general-purpose interconnection resources of the device) to programmable logic connectors (e.g., multiplexers) feeding output drivers that are otherwise normally or nominally associated with subregions in an adjacent row. This makes it possible for the subregions in one row to optionally drive interconnection resources that are normally associated with an adjacent row, thereby facilitating clustering of logic regions in adjacent rows. As an alternative or addition to the foregoing, the interconnection resources that bring signals into the regions in each row can be partly shifted or extended relative to the rows so that some signals can be more readily and directly brought into each row from the adjacent rows, again without having to make use of the more general-purpose interconnection resources of the device. This again facilitates forming clusters of logic regions in adjacent rows. As still another alternative, the interconnection resources that bring signals into each row can be substantially directly driven by signals from similar resources in another row, thereby again facilitating the formation of clusters of logic regions in adjacent rows without needing to use the general-purpose interconnection resources.

As an alternative or addition to the foregoing, clustering of logic regions along a row may be-facilitated by providing conductors associated with each logic region that extend adjacent a relatively small subplurality of the other adjacent logic regions in that row. For example, one of these conductors associated with each logic region may extend to the left from that logic region adjacent a relatively small number of other logic regions to the left of the associated logic region, and another of these conductors may extend to the right by approximately the same number of other logic regions. The same signal or different signals from the associated logic region can be applied to each of these conductors, and thereby to the other logic regions that these conductors are adjacent to. (The signals on these conductors can alternatively come from other sources.) The relatively short length, light loading, and other similar characteristics of these conductors make them especially suitable for use in providing high-speed interconnections from the associated logic region (or other signal source(s)) to the other logic regions that they are adjacent to, thereby again facilitating flexible clustering of nearby logic regions.

Further features of the invention, its nature and various advantages will be more apparent from the accompanying drawings and the following detailed description of the preferred embodiments.

DETAILED DESCRIPTION OF THE PREFERRED EMBODIMENTS

Although the principles of this invention are equally applicable to many different programmable logic device architectures, the invention will be fully understood from the following explanation of its application to programmable logic devices of the type shown in commonly assigned, co-pending, U.S. Pat. No. 6,407,576, which is hereby incorporated by reference herein in its entirety. Because the last-mentioned reference is incorporated by reference herein, it will not be necessary to actually repeat the content of that reference here. Where elements described in that reference are mentioned again here, the same reference numbers will be used here to the greatest extent possible, even though such elements may be here diagrammed more simply or described more briefly.

Figure 1:
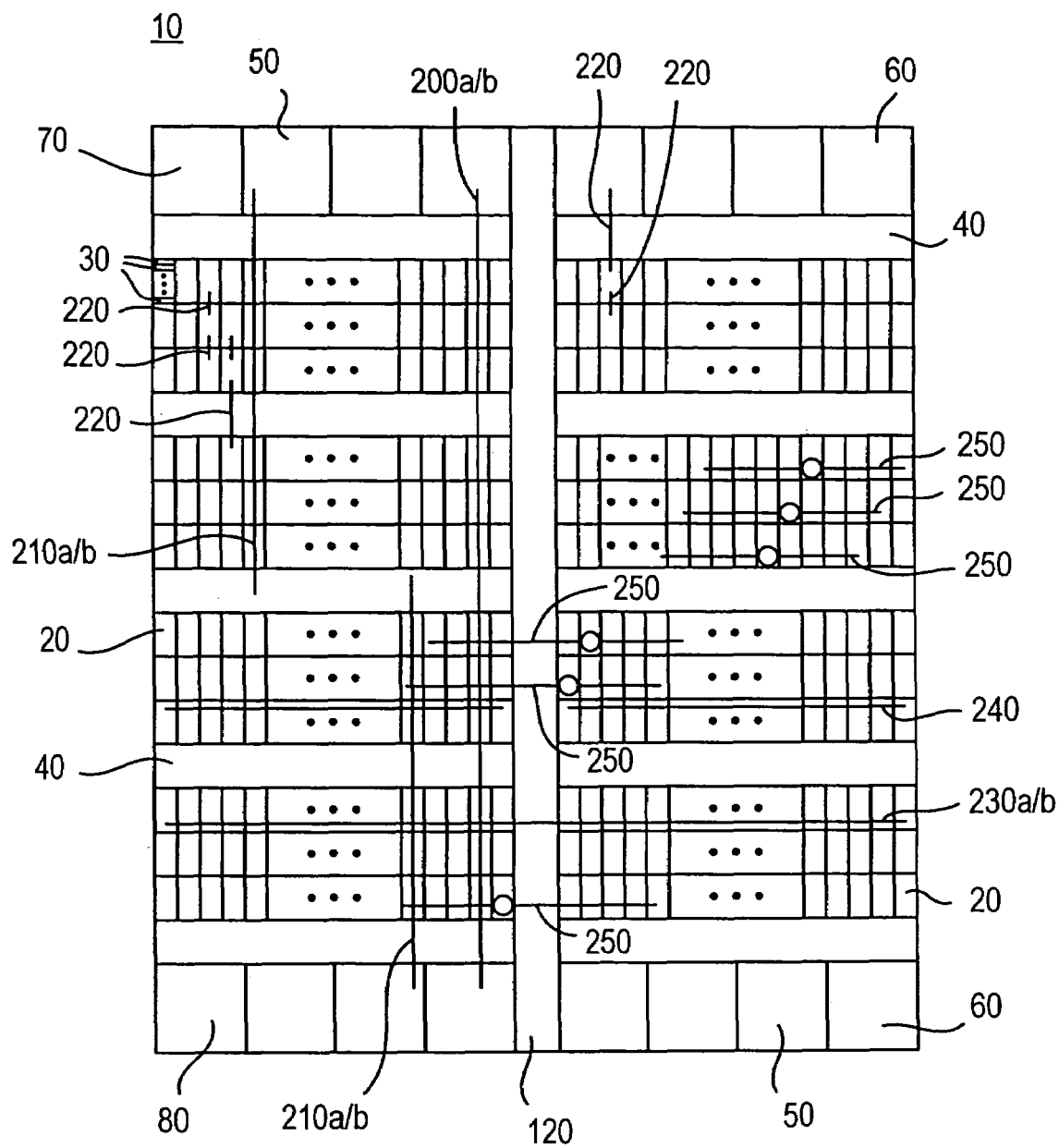
FIG. 1 is a simplified schematic block diagram of relevant portions of an illustrative programmable logic device constructed in accordance with this invention.

FIG. 1 (similar to FIG. 2 in the last-mentioned reference) shows the presently relevant portion of an illustrative programmable logic device 10 constructed in accordance with this invention. Device 10 includes several rows of regions 20 of programmable logic, each of which includes a plurality of subregions 30 of programmable logic. To avoid over-crowding the drawing, individual subregions 30 are delineated only in the extreme upper left-hand region 20 in FIG. 1. The rows of logic regions 20 are interspersed with rows of input/output ("I/O") circuitry 40. At the extreme top and bottom of the circuitry shown in FIG. 1 are rows of memory regions 50, which the user of device 10 can use as RAM, ROM, product-term logic, content addressable memory, etc. Regions 60 include phase-locked loop circuitry, region 70 includes control logic and pins, region 80 includes JTAG logic and pins, and region 120 is part of a secondary signal distribution network. The details of regions 40, 60, 70, 80, and 120 are of little interest in connection with this invention and therefore need not be significantly described herein.

Associated with each row of logic regions 20 is a plurality of global horizontal interconnection conductors 230a/b. (The "a/b" designation is from the last-mentioned reference and refers to "a" conductors having "normal" signal propagation speed characteristics and "b" conductors having higher signal propagation speed characteristics. This feature is at most only tangential to the present invention and therefore need not be further detailed herein.) Also associated with the left and right half of each row of logic regions 20 is a plurality of so-called direct horizontal interconnection conductors 240. Still further associated with subsets of horizontally adjacent regions 20 in each row are groups of so-called horizontal network of fast line ("HNFL") interconnection conductors 250.

Associated with each column of logic regions 20 (and extending across I/O regions 40 and into memory regions 50) is a plurality of global vertical interconnection conductors 200a/b. (Again, the "a/b" designation is from the last-mentioned reference and refers to some conductors 200a having normal speed and other conductors 200b having higher speed.) Associated with the upper and lower half of each column of logic regions 20 (and the associated I/O and memory circuitry 40 and 50) is a plurality of so-called half vertical interconnection conductors 210a/b. (Once again, the "a/b" designation refers to different conductors having different signal propagation speed characteristics.) Associated with vertically adjacent pairs of regions 20 and 50 are pluralities of so-called interleaved vertical ("IV") interconnection conductors 220. These conductors 220 form at least part of a first illustrative embodiment of this invention.

It will be understood that FIG. 1 shows only a few representative ones of each of the various types of interconnection conductors mentioned above.

Figure 2:
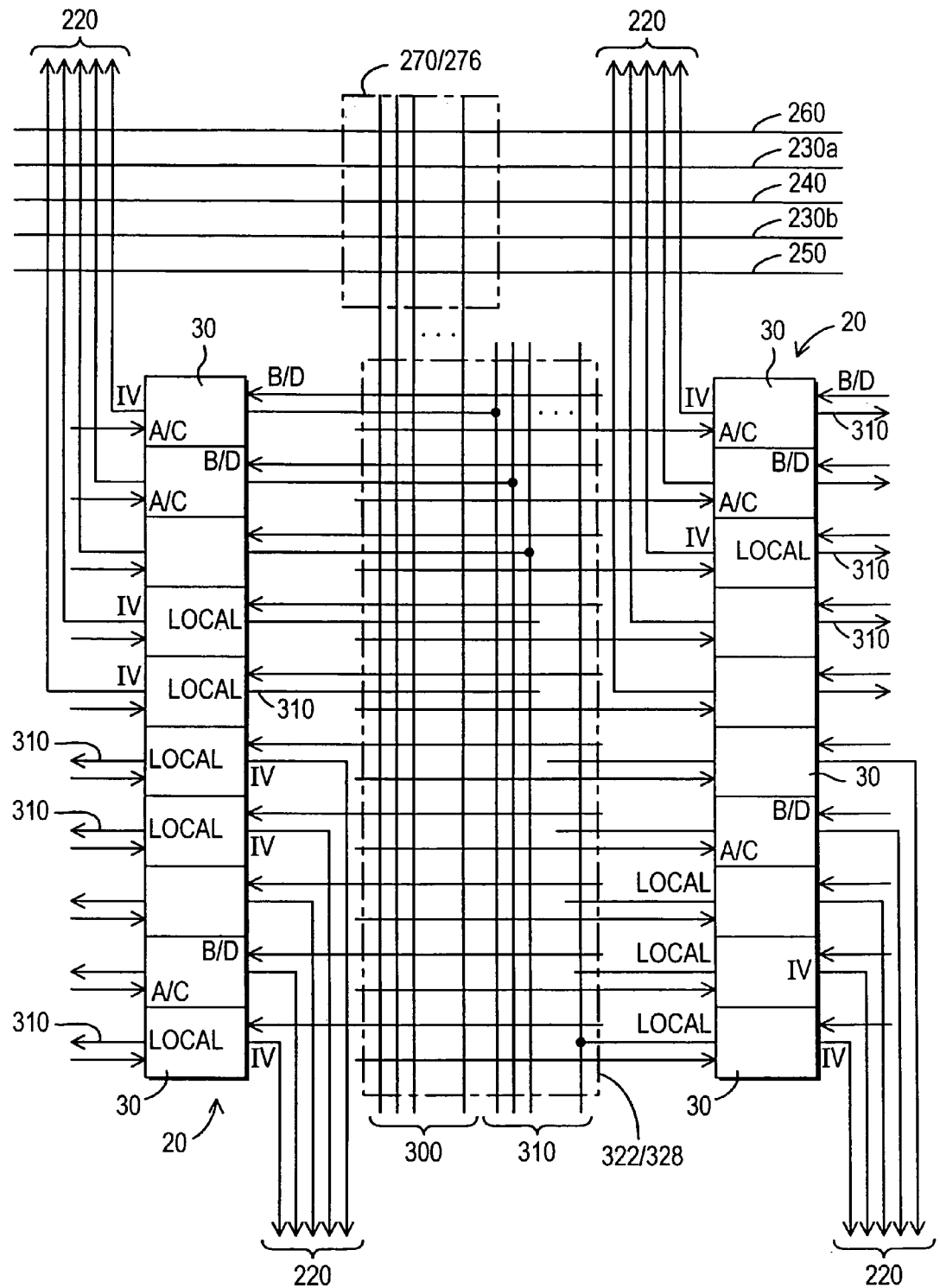
FIG. 2 is a more detailed, but still simplified, schematic block diagram of a representative portion of the programmable logic device shown in FIG. 1.
Figure 3:
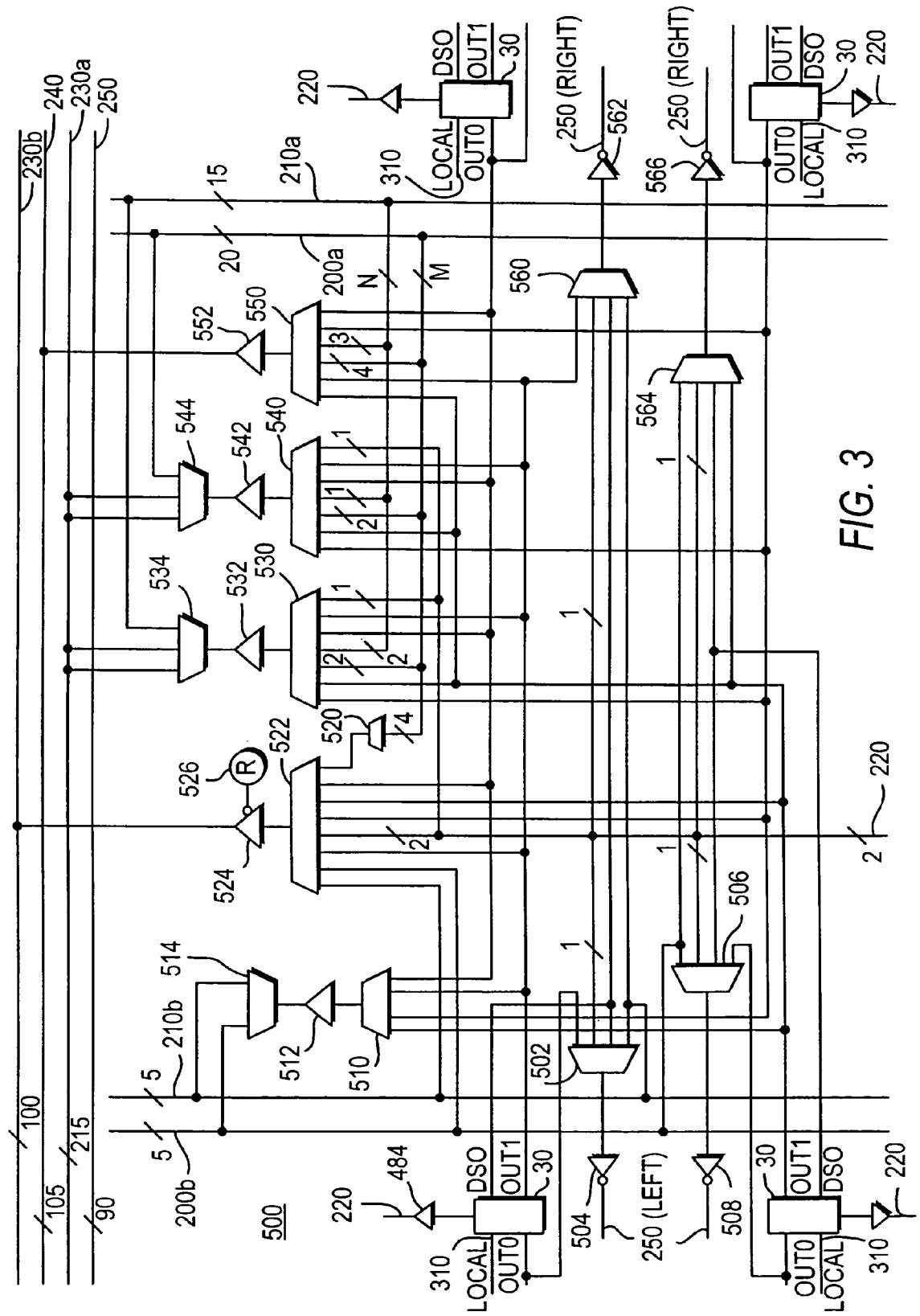
FIG. 3 is a more detailed, but still simplified, schematic block diagram of an illustrative embodiment of another representative portion of the device shown in FIG. 1.

FIG. 2 shows selected circuitry associated with two, representative, horizontally adjacent logic regions 20 in a typical row of such regions. The circuitry shown in FIG. 2 includes selected circuitry for supplying signals to the subregions 30 in the depicted regions 20, and selected circuitry for conveying signals from those subregions. Note that between the depicted regions are a plurality of region-feeding conductors 300 and a plurality of local feedback conductors 310. Signals on the conductors 230a/b, 240, 250, and 260 associated with the row that includes depicted regions 20 can be applied to region-feeding conductors 300 via programmable logic connector ("PLC") and driver circuitry 270/276. Circuitry 270/276 may be constructed as shown in FIG. 3 of the last-mentioned reference (see also FIG. 7 herein). Local feedback conductors 310 are supplied with the so-called LOCAL output signals of selected ones of the depicted subregions 30. In particular, half of the subregions 30 in each depicted region 20 supply their LOCAL output signals to the local feedback conductors 310 between those regions. (The LOCAL output signals of the other subregions go to local feedback conductors to the left or right of the representative circuitry shown in FIG. 2.)

Figure 4:
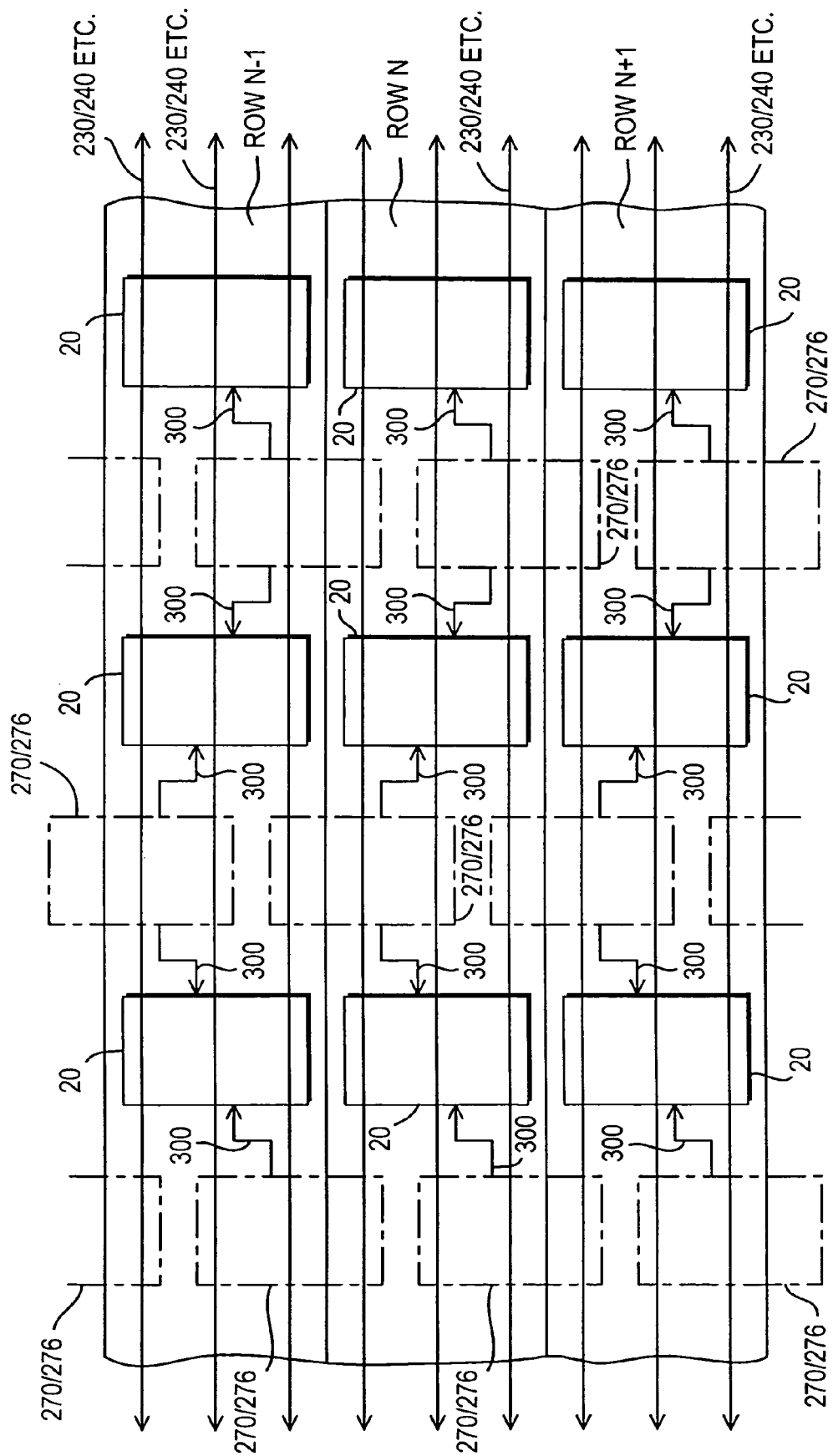
FIG. 4 is a simplified schematic block diagram of a representative portion of an alternative embodiment of certain aspects of the FIG. 1 device in accordance with the invention.

Signals on depicted conductors 300/310 can be applied to subregion input terminals A-D via PLC circuitry 322/328. Circuitry 322/328 may be constructed as shown in FIG. 4 of the last-mentioned reference. Two of the four main data input signals A-D of each of the depicted subregions come from the conductors 300/310 and circuitry 322/328 to the right of that subregion, and the other two of those inputs come from the elements 300/310/322/328 to the left of that subregion. In particular, the B and D inputs to each subregion 30 come from the right, and the A and C inputs to each subregion 30 come from the left.

Each subregion 30 may be constructed as shown in FIGS. 5A and 5B of the last-mentioned reference. Thus each subregion 30 may include (among other components) a four-input look-up table or other combinatorial logic circuitry for producing an intermediate signal which is any logical combination of the four main data inputs A-D to the subregion. Each subregion 30 may further include a register for registering the intermediate signal, and PLC circuitry for outputting either the intermediate signal or the register output signal as any of a LOCAL output signal 310, an interleaved vertical ("IV") output signal 220, and/or two more global output signals (not shown in FIG. 2, but shown as OUT0 and OUT1 in FIG. 3. In particular, any of the above-mentioned four outputs of a subregion 30 can be separately selected to be either the intermediate signal or the register output signal of that subregion.

FIG. 2 also shows that the IV outputs 220 of half the subregions 30 on the left and half the subregions 30 on the right extend upwardly (to the row of regions 20 above the row shown in part in FIG. 2), and that the IV outputs 220 of the other half of the subregions on the left and right extend downwardly (to the row of regions 20 below the row shown in part in FIG. 2). The particular pattern for the IV outputs to go up and down can be different from that shown in FIG. 2 if desired. For example, whereas FIG. 2 shows that the IV outputs of the upper half of the subregions 30 go up, and the IV outputs of the lower half of the subregions go down, a different pattern is suggested in FIG. 3, which shows the IV outputs 220 of vertically alternating subregions 30 going up and down. The same is true for the left-right patterns of LOCAL outputs shown in FIG. 2. That is, a different pattern of LOCAL outputs can be used instead of the pattern shown in FIG. 2 in which the upper half of the subregions 30 in each region 20 have their LOCAL outputs going to the right and the lower half have their outputs going to the left. An example of a different pattern would be to have vertically alternating subregions going to the left and right in terms of LOCAL output.

FIG. 3 shows circuitry 500 associated with four representative subregions 30 (two subregions in each of two horizontally adjacent regions 20), principally for applying the output signals of those subregions to adjacent horizontal and vertical conductors and for making interconnections between adjacent horizontal and vertical conductors (e.g., so that signals can turn from horizontal to vertical conductors or vice versa). FIG. 3 is similar to FIG. 6 in the last-mentioned reference. Much of what is shown in FIG. 3 is not especially important to the present invention. Those unimportant or relatively unimportant portions of FIG. 3 will therefore not be described in full detail herein, it being appreciated that the last-mentioned reference provides a full discussion (in connection with FIG. 6 of the last-mentioned reference) of all portions of this FIG. that are not described here. In addition, operation of portions of FIG. 3 that are not specifically described here can generally be inferred from the portions that are described.

The portions of FIG. 3 that are germane to the present invention are those that are associated with the two conductors 220 shown in that FIG. Initially it should be said that one of the conductors 220 shown in FIG. 3 comes from the IV output of a subregion 30 in the row above the row shown in part in that FIG., and the other of those two conductors 220 comes from the IV output of a subregion 30 in the row below the row shown in part in FIG. 3. (Although the representative circuitry shown in FIG. 3 includes four subregions 30, producing four IV output signals 220, the FIG. 3 circuitry only receives two IV input signals 220. This does not mean, however, that there is a net excess of IV outputs. The explanation for this is that there is additional similar driver circuitry 500 to the left/right of what is shown in FIG. 3 which utilizes the IV outputs that would appear to be excess if only a vertical slice like what is shown in FIG. 3 is considered.)

Both of the IV input signals 220 to the circuitry shown in FIG. 3 are among the inputs to PLC 522. One of the IV input signals 220 to the circuitry shown in FIG. 3 is among the inputs to three out of six PLCs 502, 506, 530, 540, 560, and 564. The other IV input signal 220 to FIG. 3 is among the inputs to the other three out of the six just-mentioned PLCs.

Other inputs to PLC 522 are (1) the signal from an adjacent global vertical conductor 200b, (2) the signal from an adjacent half vertical conductor 210b, (3) one of the global output signals ("OUT1") of the upper left-hand subregion 30, (4) one of the global output signals ("OUT0") of the lower right-hand subregion 30, (5) one of the global output signals ("OUT1") of the lower left-hand subregion 30, (6) one of the global output signals ("OUT0") of the upper right-hand subregion 30, and (7) the signal from a selected one of four adjacent global vertical conductors 200a. (PLC 520 makes the one-of-four selection referred to at the end of the preceding sentence.)

PLC 522 is programmable (e.g., by programmable function control elements ("FCEs") that are not shown in FIG. 3, but that are like FCE 526 shown in FIG. 3 for controlling tri-state driver 524) to select any one of its input signals as its output signal. The output signal of PLC 522 is applied to tri-state driver 524. If tri-state driver 524 is enabled by the associated FCE 526, driver 524 amplifies the signal it receives and applies the resulting amplified signal to one of the adjacent fast or high-speed global horizontal conductors 230b. (If tri-state driver 524 is not thus enabled by the associated FCE 526, the driver is off and looks like a high impedance to the associated conductor 230b.)

From the foregoing it will be seen that application to PLC 522 of IV output signals from the row above and the row below allows PLC 522 and its associated tri-state driver 524 to be used to apply one of those IV signals from an adjacent row to a global horizontal conductor 230b associated with the row partly shown in FIG. 3. In that way a subregion 30 in the row above or below the partly depicted row can effectively "steal" elements 522 and 524 from the partly depicted row and thereby become (for at least the purposes served by elements 522 and 524) like a subregion in the depicted row. Elements 220, 522, and 524 therefore allow a subregion 30 in an adjacent row to provide very direct drive to one of the conductors 230b in the partly depicted row. Although other elements in the partly depicted row could be driven by this type of IV signal routing, in the particularly preferred embodiment shown this IV routing is very high-speed by virtue of being through relatively large and strong tri-state driver 524 to a high-speed conductor 230b. From conductor 230b a signal can get to any of the regions 20 in the row served by that conductor.

Other possible routings of the IV signals 220 provided by the FIG. 3 circuitry will now be discussed.

As has been mentioned, one of the two IV signals received by the FIG. 3 circuitry from the two adjacent rows is applied to one input terminal of PLC 530. PLC 530 can select this IV signal input in lieu of any of its other inputs for application to buffer 532. The output signal of buffer 532 is applied to PLC 534 (e.g., a demultiplexer). PLC 534 is programmable to apply its input signal to any one or more of two of the adjacent normal-speed global horizontal conductors 230a and one of the adjacent normal-speed half vertical conductors 210a.

The PLC 540 routing of one of the received IV signals 220 is similar to that just described for PLC 530, except that in the case of routing via elements 540, 542, and 544, one of the possible destinations is one of the adjacent normal-speed global vertical conductors 200a.

The PLC 502 routing of one of the received IV signals 220 allows that IV signal to be applied to inverting buffer 504 in lieu of the other inputs to PLC 502. The output signal of buffer 504 is applied to one of the adjacent HNFL conductors 250 that extends to the left adjacent several other logic regions 20 from the circuitry shown in FIG. 3. The same IV signal 220 is also applied to one input terminal of PLC 560. PLC 560 can select that signal for application to inverting buffer 562 and thereby to another adjacent HNFL conductor 250 that extends to the right adjacent several other logic regions 20 from the circuitry shown in FIG. 3. Thus the IV signal being discussed can be applied to a leftward extending HNFL conductor 250, a rightward extending HNFL conductor 250, or to both of those conductors. As is described in more detail below in connection with FIG. 6, HNFL conductors 250 provide relatively high-speed communication—from the associated source logic region(s) 20 to any of the logic regions 20 that they pass adjacent to—because of the relatively short length, light loading, etc., of the HNFL conductors.

The PLC 506 and PLC 564 IV signal routing is similar to that described for PLCs 502 and 560, except that the other of the two IV signals 220 received by the FIG. 3 circuitry is applied to PLCs 506 and 564, and different HNFL conductors 250 are driven by inverting buffers 508 and 566.

From the foregoing, it will be seen that the IV connections 220 between adjacent rows of logic regions 20 facilitate flexible formation of clusters of logic regions or subregions, as well as relatively high-speed communication within such clusters. For example, using an IV connection 220 and routing via elements like 522 and 524, a subregion 30 in one row can be clustered with (i.e., relatively directly coupled to) any of the subregions in one of the adjacent rows. The same is true (albeit using somewhat slower, normal-speed global horizontal conductors 230a) via elements 530/532/534 or 540/542/544. As another example, using an IV connection 220 and routing via elements like 502, 506, 560, and/or 564, a subregion 30 in one row can be clustered with any of the logic regions 20 in an adjacent row served by the associated HNFL conductors 250 in the adjacent row. In addition to providing more direct, and therefore higher speed interconnections between adjacent rows, the provision of IV conductors 220 reduces the need to use longer-haul and more general-purpose vertical conductors 200 and 210 for inter-row connections. This helps to reduce the numbers of conductors 200 and 210 that must be provided on the device.

It should be noted that the clustering options afforded by the above-described IV circuitry are preferably boundaryless within the array of logic regions 20. By this it is meant that any logic region 20 can serve as a member of a cluster, and the cluster can extend from that logic region in substantially the same way regardless of the logic region that is chosen as the cluster member being considered. Only the physical edges of the logic region array bound the possible clusters.

An alternative embodiment of the invention which facilitates flexible clustering of subregions 30 in one row with logic regions 20 (and their subregions 30) in another adjacent row is shown in FIG. 4. Although for clarity FIGS. 2 and 3 show the horizontal interconnection conductors 230/240/250/260 associated with a typical row laterally displaced from the other circuitry of that row, FIG. 1 is somewhat less schematic more physically accurate in that it shows the horizontal conductors and other circuitry of each row super-imposed on or interspersed with one another. FIG. 4 shows the horizontal conductors 230/240/250/260 in the same super-imposed or interspersed way.

In FIG. 4 the horizontal conductors 230/240/250/260 associated with each row are shown subdivided into three laterally spaced subsets, each of which preferably includes some of each type of conductor (especially some of each of conductors 230, 240, and 250). FIG. 4 further shows the PLCs 270/276 nominally associated with each row and each group of logic region feeding conductors 300 shifted vertically relative to the associated row so that some of the inputs to those PLCs come from the horizontal conductors 230/240 etc. associated with one of the rows that is adjacent to the row with which the PLCs 270/276 are nominally associated. Considering, for example, the left-most logic region 20 shown in row N in FIG. 4, the PLCs 270/276 that feed the conductors 300 to the left of that logic region receive their inputs from the lower two subsets of the horizontal conductors 230/240 etc. associated with row N and from the upper-most subset of the horizontal conductors 230/240 etc. associated with the row below row N (i.e., row N+1). This arrangement makes it possible to feed signals from row N+1 to any of the subregions 30 in the exemplary region 20 being discussed very directly and without having to make use of the vertical interconnection resources (e.g., elements 200/210) of the device.

Similarly, the PLCs 270/276 that feed the conductors 300 to the right of the left-most logic region 20 shown in row N in FIG. 4 receive their inputs from the upper two subsets of the horizontal conductors 230/240 etc. associated with row N and from the lower-most subset of the horizontal conductors 230/240 etc. associated with the row above row N (i.e., row N−1). This makes it possible to feed signals from row N−1 to any of the subregions 30 in the logic region 20 being discussed very directly and without having to use the other vertical interconnection resources (e.g., elements 200/210) of the device.

It should be noted that because each PLC group 270/276 is interleaved between two logic regions 20 (one region to the left and one region to the right) as is described more fully above in connection with FIG. 2, the inputs to each group 270/276 from the adjacent row are available to both regions 20 served by that group 270/276 and its associated conductors 300.

Figure 5:
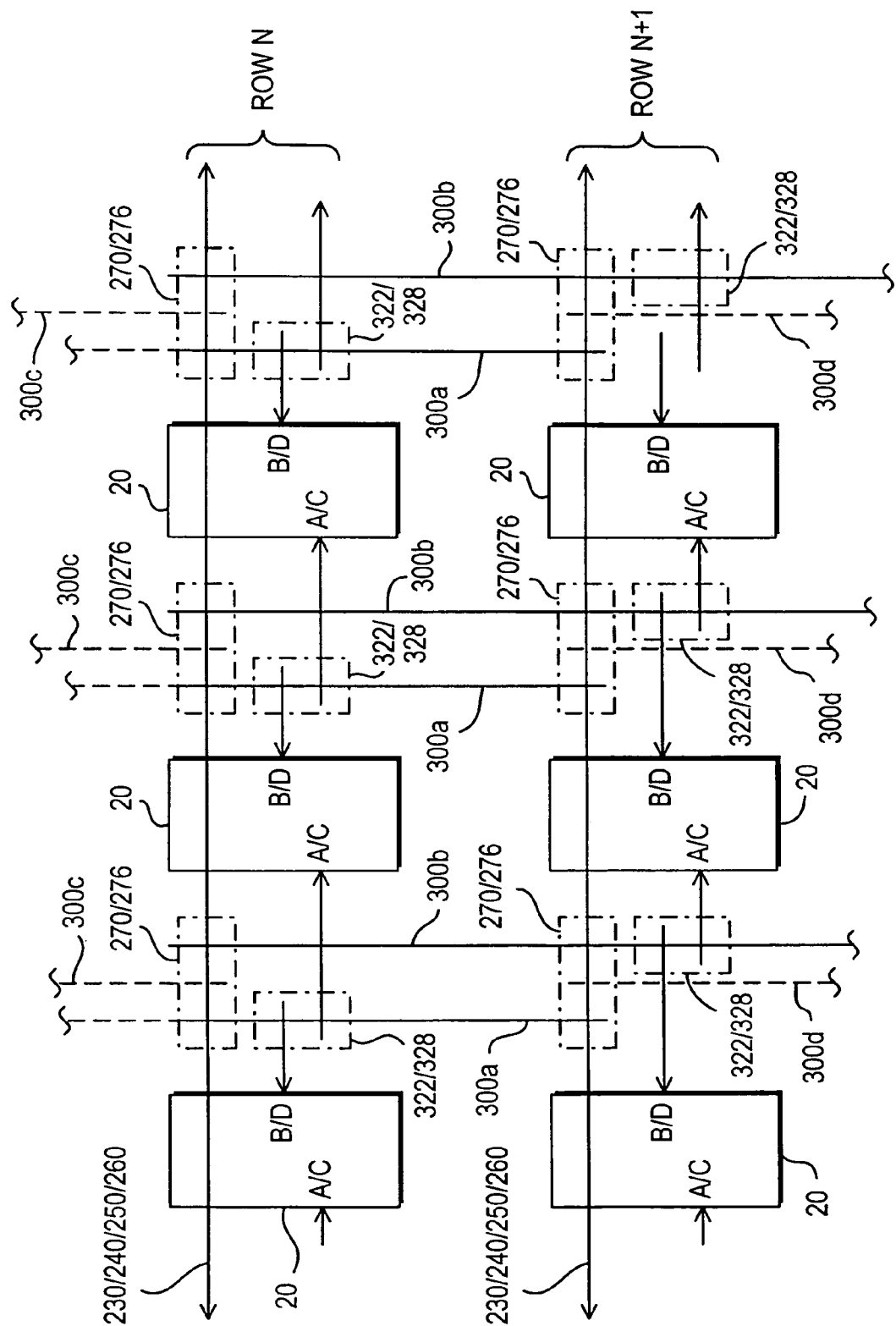
FIG. 5 is a simplified schematic block diagram of a representative portion of an another alternative embodiment of certain aspects of the FIG. 1 device in accordance with the invention.

A possible alternative to shifting the groups of PLCs 270/276 as shown in FIG. 4 is shown in FIG. 5. In the FIG. 5 alternative at least some of the region-feeding conductors 300 interleaved between each horizontally adjacent pair of logic regions 20 in each row extend into the row above or below that row for programmably selectable connection to the horizontal conductors 230/240/250/260 associated with that other row. Considering, for example, the conductors 300a that serve any two adjacent logic regions 20 in the upper-row ("row N") in FIG. 5, those conductors 300a can receive signals (via PLCs 270/276) from both the conductors 230/240/250/260 associated with row N and the conductors 230/240/250/260 associated with the row below row N (i.e., "row N+1"). Similarly, the conductors 300b that serve any two adjacent logic regions 20 in row N+1 in FIG. 5 can receive signals (via PLCs 270/276) from both the conductors 230/240/250/260 associated with row N+1 and the conductors 230/240/250/260 associated with row N. The interconnection arrangement described above for rows N and N+1 can be continued to other adjacent rows (e.g., as shown by the dotted line conductors 300c and the dotted extensions of conductors 300a extending from row N to row N−1 (not shown), and as shown by the dotted line conductors 300d and the dotted extensions of conductors 300b extending from row N+1 to row N+2 (not shown).

Like the arrangements shown in earlier FIGS., arrangements of the type shown in FIG. 5 facilitate direct clustering of a logic region 20 in one row with logic regions in an adjacent row without the need to use other vertical interconnection resources such as elements 200 and 210 to provide inter-row communication. Also, like the arrangements shown in earlier FIGS., the clustering options afforded by FIG. 5 are high-speed and flexible (e.g., they can be essentially boundary-less within the array of logic regions 20).

The HNFL conductors 250 that have already been occasionally mentioned also facilitate flexible clustering of logic regions 20 without recourse to the general interconnection conductor resource network in accordance with this invention. Accordingly the HNFL conductors will now be considered in more detail in connection with FIGS. 6 and 7.

Figure 6:
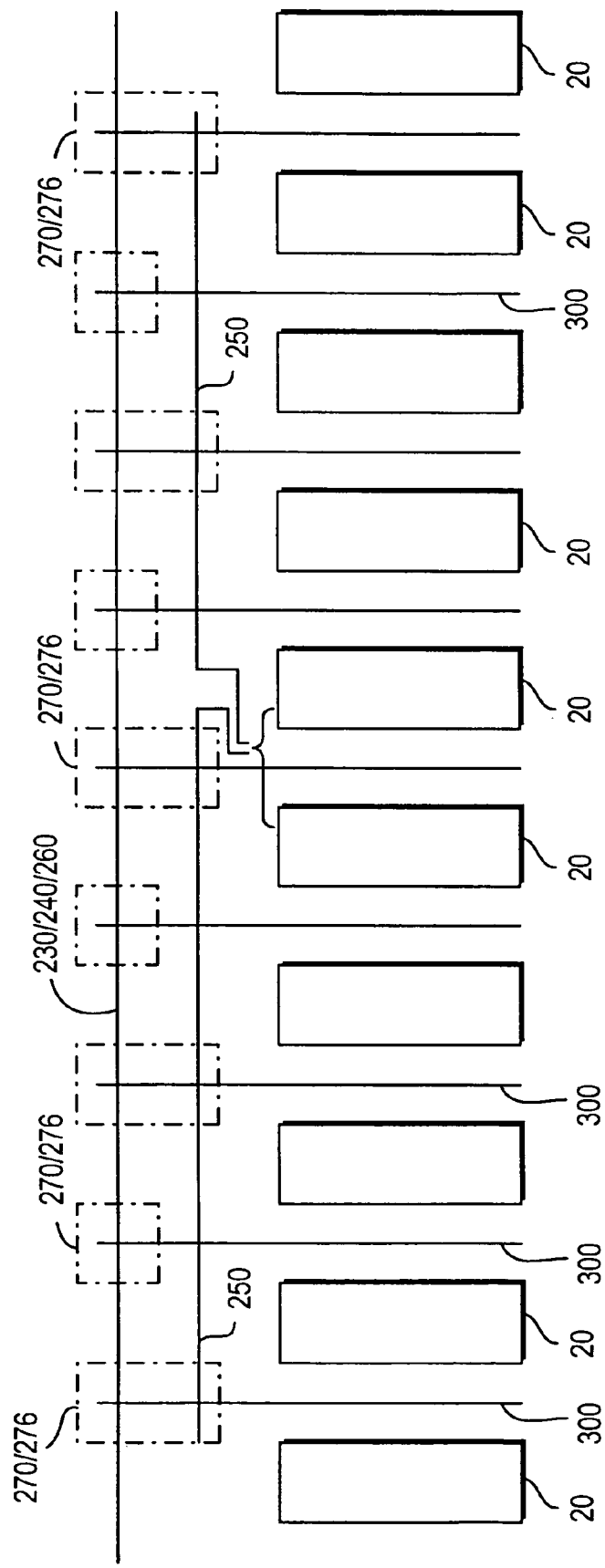
FIG. 6 is a more detailed, but still simplified, schematic block diagram of an illustrative embodiment of another representative portion of the FIG. 1 device in accordance with the invention.

FIG. 6 shows that typical HNFL conductors 250 originate at a driver block 500 (FIG. 3) associated with a horizontally adjacent pair of logic regions 20 and extend, respectively, to the left and right of the source logic regions by a relatively small (but preferably plural) number of other logic regions. For example, each HNFL conductor 250 may extend four or five logic regions 20 to the left or right of the source logic regions. The possible sources of the signals on HNFL conductors 250 have been described above in connection with FIG. 3. PLC groups 270/276 (shown in more detail in FIG. 7 and described in more detail below in connection with that FIG.), associated with the region-feeding conductors 300 between at least some of the horizontally adjacent logic regions 20 that the HNFL conductors 250 pass, can apply the HNFL conductor signals to those region-feeding conductors for application to the logic regions on either side of those conductors 300. FIG. 6 shows the PLC groups 270/276 associated with only every other region-feeding conductor group 300 being able to make such connections from the HNFL conductors 250. This helps reduce the loading on the HNFL conductors, thereby helping to increase the operating speed of those conductors. As an alternative, however, all PLC groups 270/276 may have the capability of making connections from the HNFL conductors.

Figure 7:
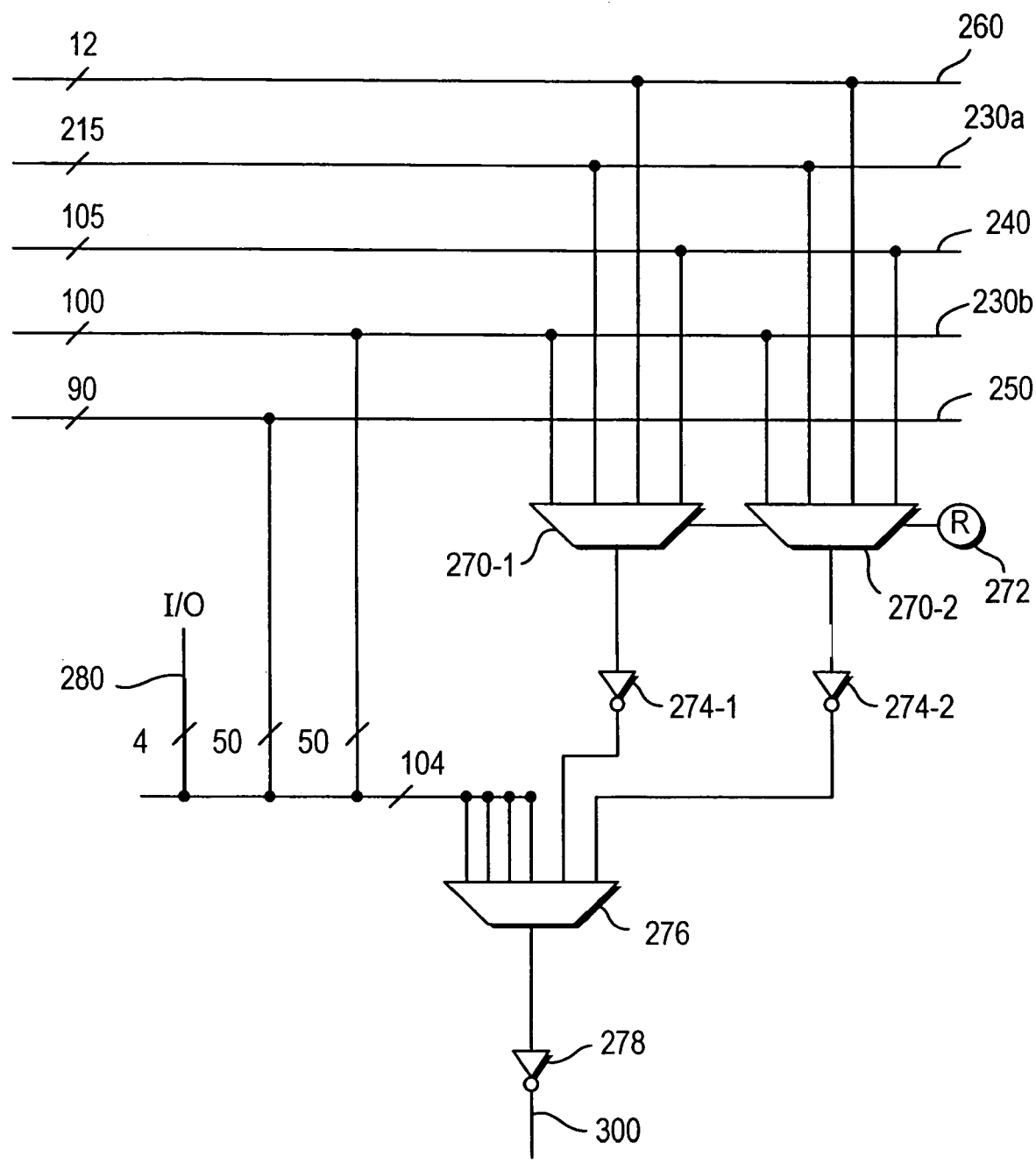
FIG. 7 is a more detailed, but still simplified, schematic block diagram of an illustrative embodiment of still another representative portion of the FIG. 1 device in accordance with the invention.

As has been mentioned, FIG. 7 shows a representative PLC group 270/276 in more detail. FIG. 7 is similar to FIG. 3 in the last-mentioned reference. Accordingly, only the portion of FIG. 7 that is particularly pertinent to the present invention will be described in full detail herein. FIG. 7 shows that one or more of the HNFL conductors served by a PLC 276 can be applied to input terminals of that PLC. PLC 276 is programmable (by FCEs that are not shown but that can be similar to FCEs 272) to apply any one of its inputs to inverting buffer 278 and thereby to a region-feeding conductor 300. To increase the speed with which an HNFL conductor signal can reach region-feeding conductor 300, the HNFL conductor(s) are connected substantially directly to relatively small, downstream PLC 276, thereby effectively bypassing upstream PLCs 270 (which can select signals from other conductors 230, 240, and 260 associated with the row that includes PLCs 270/276).

To briefly recapitulate the foregoing discussion of HNFL conductors 250, these conductors facilitate flexible high-speed clustering of nearby logic regions due to such characteristics as the following: (1) there is only a single source for the signal on each HNFL conductor (i.e., the driver block 500 associated with the pair of logic regions 20 near the midpoint of a left- and right-extending pair of HNFL conductors 250), (2) the HNFL conductors are relatively short, (3) the HNFL conductor signals are applied to region-feeding conductors 300 via downstream PLCs 276 that bypass other upstream PLCs 270, and (4) the PLC groups 270/276 connect the HNFL conductors to only certain groups of region-feeding conductors 300 that the HNFL conductors pass.

From FIG. 3 and the earlier discussion of that FIG. it will be appreciated that each leftwardly extending HNFL conductor 250 is effectively paired with a rightwardly extending conductor 250. Both conductors in each such pair can be driven by the same signal, or different signals can be applied to each conductor in any pair. The sources of the HNFL signals are subregion 30 output signals, interleaved conductor 220 signals, and fast vertical interconnection conductor 210b signals.

Figure 8:
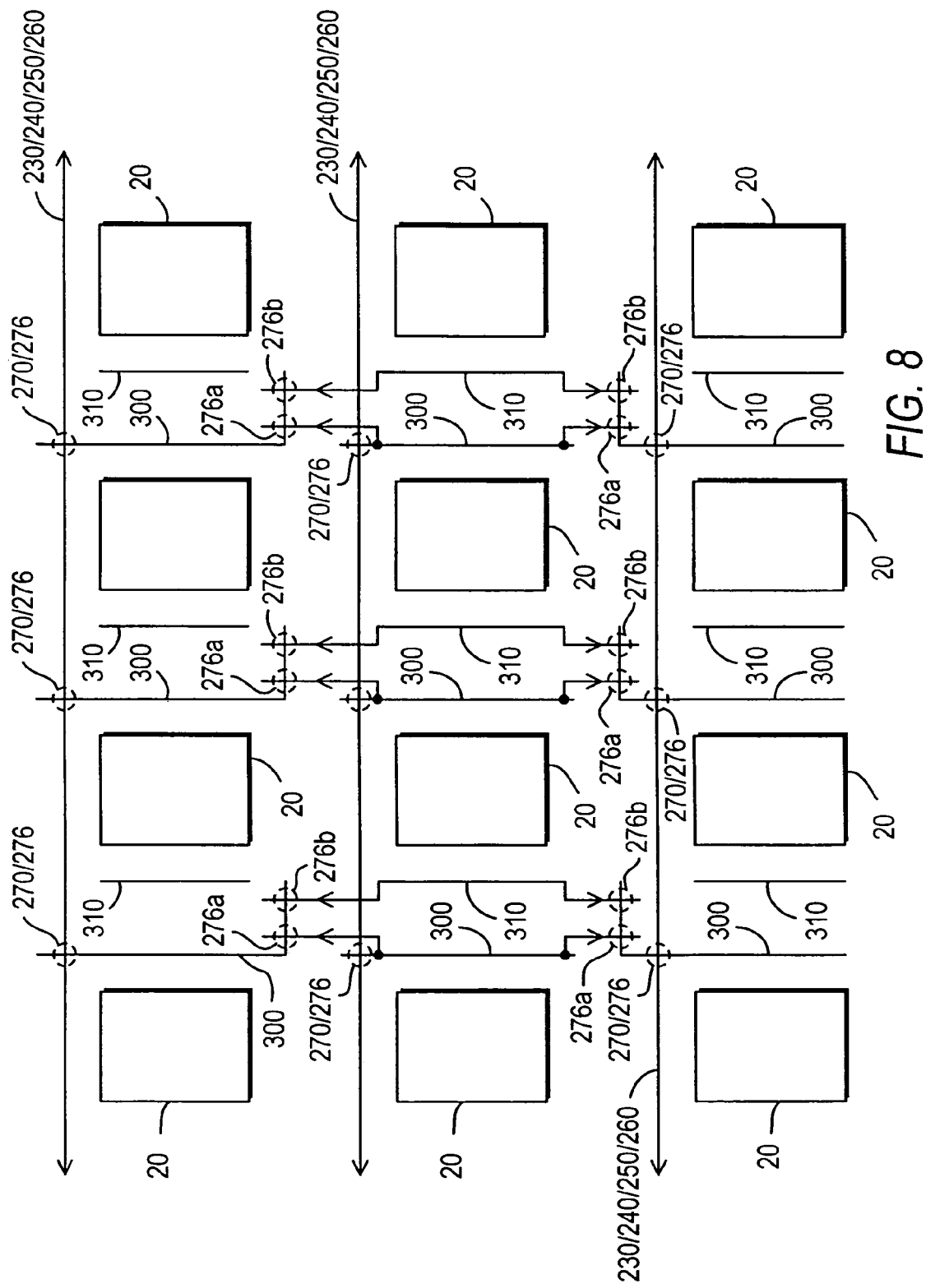
FIG. 8 is a more detailed, but still simplified, schematic block diagram of an illustrative embodiment of yet another representative portion of the FIG. 1 device in accordance with the invention.

FIG. 8 shows an illustrative embodiment of another type of conductor arrangement that facilitates flexible, close, and direct (i.e., high-speed) association of nearby logic regions 20 without having to make use of the more general interconnection resources of the device. In this embodiment at least some of the region-feeding conductors 300 interleaved between each horizontally adjacent pair of logic regions 20 in the center row have relatively direct programmable connections 276a to at least some of the region-feeding conductors 300 interleaved between the logic regions above and below the first-mentioned logic regions. Similarly, at least some of the local feedback conductors 310 interleaved between each horizontally adjacent pair of logic regions 20 in the center row have relatively direct programmable connections 276b to at least some of the region-feeding conductors 300 interleaved between the logic regions above and below the first-mentioned logic regions. Programmable connections 276a and 276b may be additional inputs to downstream (and therefore relatively fast) PLCs 276 in FIG. 7. Alternatively, connections 276a and 276b may be programmably controlled (e.g., by FCEs) pass gates or transistors between the conductors 300/310 associated with those connections 276a/276b. Such pass gates or transistors are also sometimes referred to herein as PLCs.

Connections 276a allow a signal applied to a region-feeding conductor 300 associated with the center row (e.g., from any of the conductors 230/240/250/260 associated with the center row) to be applied not only to the center row logic regions 20 to the left and/or right of that conductor 300, but also to the adjacent logic regions 20 above and/or below those logic regions (i.e., in the adjacent rows above and below the center row). Similarly, connections 276b allow a signal applied to a local feedback conductor 310 associated with the center row (i.e., from the associated subregion 30 in a region to the left or right of that conductor 310) to be applied not only to the center row logic regions to the left and/or right of that conductor 310, but also to the adjacent logic regions 20 above and/or below those logic regions (i.e., in the adjacent rows above and below the center row). Connections 276a and 276b therefore facilitate rapid and close association of logic regions that are generally vertically adjacent to one another. For example, connections 276a facilitate application of the same signals (from the conductors 230/240/250/260 associated with the center row) to vertically adjacent logic regions 20. Connections 276b facilitate application of signals from center row logic regions 20 to other vertically adjacent logic regions 20.

Although both types of connections 276a and 276b are shown in FIG. 8, it will be understood that only one of these two types of connections may be provided, with the other type being omitted. Similarly, the numbers and patterns of conductors 300/310 that have connections 276a and/or 276b may be varied as desired. Whereas FIG. 8 only shows signals flowing from center row conductors 300/310 to vertically adjacent row conductors 300, it will be understood that similar connections can be provided for allowing signal flow in the opposite direction or in other patterns or ways between vertically adjacent rows.

Figure 9:
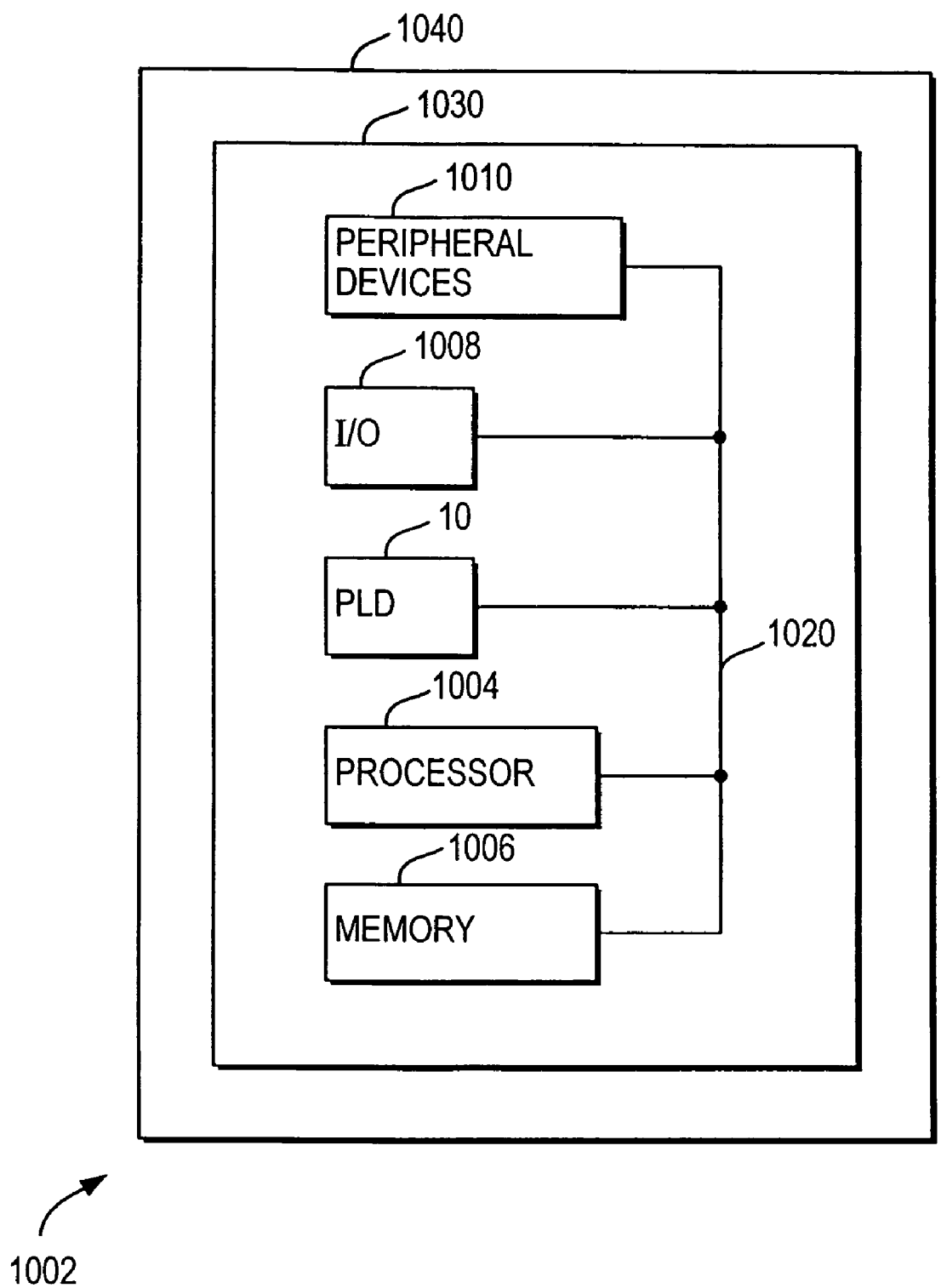
FIG. 9 is a simplified block diagram of an illustrative system employing a programmable logic device in accordance with the invention.

FIG. 9 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.). FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiments. This applies to such parameters as the numbers of rows and columns of the various types of circuitry, the number of subregions 30 in each region 20, the numbers of the various types of interconnection conductors, the numbers and sizes of the PLCs provided for making interconnections between various types of interconnection conductors, etc. It will also be understood that various directional and orientational terms such as "vertical" and "horizontal," "left" and "right," "above" and "below," "row" and "column," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Terms like "region" and "subregion" are also used only as generic, relative terms, and other terms may be used for generally similar circuitry. Indeed, these terms may be used interchangeably herein in contexts in which a region/subregion hierarchy is not important. Alternatively, devices within the scope of this invention may have regions of programmable logic that are not divided into subregions. Although look-up table logic is employed in the illustrative embodiments shown and described herein, it will be understood that other types of logic may be used instead if desired. For example, sum-of-products logic, such as is the primary example considered in references like Pederson et al. U.S. Pat. No. 5,241,224 and Patel et al. U.S. Pat. No. 5,371,422 (both of which are hereby incorporated by reference herein in their entireties), may be used instead of look-up table logic.

The invention claimed is:

1. A programmable logic integrated circuit device comprising:
   a plurality of regions of programmable logic disposed on the device in a two-dimensional array of intersecting rows and columns;
   a plurality of interconnection conductors associated with each of the rows and configured to convey signals to, from, and/or between the logic regions in the associated row;
   a first programmable logic connector associated with a first plurality of interconnection conductors associated with a first row of the plurality of regions of programmable logic, the first programmable logic connector configured to selectively apply an output signal of a first region of programmable logic of the first row substantially directly to a conductor of the first plurality of interconnection conductors; and
   a second programmable logic connector associated with a second plurality of interconnection conductors associated with a second row of the plurality of regions of programmable logic, the second programmable logic connector configured to selectively apply an output signal of the first region substantially directly to a conductor of the second plurality of interconnection conductors.

2. The device of claim 1, wherein the second row is adjacent to the first row.

3. The device of claim 1, further comprising:
a third programmable logic connector associated with a third plurality of interconnection conductors associated with a third row of the plurality of regions of programmable logic, the third programmable logic connector configured to selectively apply an output signal of the first region substantially directly to a conductor of the third plurality of interconnection conductors.

4. The device of claim 3, wherein the second and third rows are adjacent to the first row and located on either side of the first row.

5. The device of claim 1, further comprising:
a plurality of first conductors, each first conductor being associated with a corresponding logic region of the first row and configured to apply an output signal of the corresponding logic region of the first row substantially directly to a programmable logic connector associated with the first plurality of interconnection conductors; and
a plurality of second conductors, each second conductor being associated with a corresponding logic region of the first row and configured to apply an output signal of the corresponding logic region of the first row substantially directly to a programmable logic connector associated with the second plurality of interconnection conductors.

6. The device of claim 1, further comprising:
at least one local feedback conductor associated with the first logic region, the local feedback conductor operative to receive a logic region output signal of the first logic region for application as at least one input signal to the first logic region.

7. The device of claim 6, wherein the at least one local feedback conductor is operative to receive a logic region output signal of the first logic region for application as at least one input signal to a second logic region immediately adjacent to the first logic region.

8. The device of claim 7, wherein the first and second logic regions are in the same row.

9. The device of claim 1, wherein the first programmable logic connector is configured to selectively apply an output signal of a second region of programmable logic of the second row substantially directly to a conductor of the first plurality of interconnection conductors.

10. The device of claim 9, wherein the second programmable logic connector is configured to selectively apply an output signal of the second region substantially directly to a conductor of the second plurality of interconnection conductors.

11. A digital processing system comprising:
processing circuitry;
a memory coupled to said processing circuitry;
a programmable logic integrated circuit coupled to said processing circuitry and said memory, said programmable logic integrated circuit comprising:
a plurality of regions of programmable logic disposed on the device in a two-dimensional array of intersecting rows and columns;
a plurality of interconnection conductors associated with each of the rows and configured to convey signals to, from, and/or between the logic regions in the associated row;
a first programmable logic connector associated with a first plurality of interconnection conductors associated with a first row of the plurality of regions of programmable logic, the first programmable logic connector configured to apply an output signal of a first region of the first row substantially directly to a conductor of the first plurality of interconnection conductors; and
a second programmable logic connector associated with a second plurality of interconnection conductors associated with a second row of the plurality of regions of programmable logic, the second programmable logic connector configured to apply an output signal of the first region substantially directly to a conductor of the second plurality of interconnection conductors.

12. A programmable logic integrated circuit device comprising:
a plurality of regions of programmable logic disposed on the device in a two-dimensional array of regions, the regions being substantially aligned along first and second array dimensions;
a plurality of first interconnection conductors configured to convey signals to, from, and/or between lines of logic regions substantially aligned along the first array dimension;
a plurality of second interconnection conductors associated with two or more logic regions substantially aligned along the second array dimension, and configured to convey at least one logic region output signal to, from, and/or between a plurality of logic regions substantially aligned along the second array dimension; and
at least one programmable logic connector respectively associated with each of the first interconnection conductors and configured to apply any of a plurality of PLC input signals to the first interconnection conductor associated with that programmable logic connector, wherein at least one of the PLC input signals being applied to each programmable logic connector is a logic region output signal of a logic region of a first line of logic regions substantially aligned with the first array dimension, and wherein at least one of the PLC input signals being applied to each programmable logic connector is transmitted via one of the second interconnection conductors such that this signal is substantially directly applied to the programmable logic connector from the output of a logic region of a second line of logic regions substantially aligned with the first array dimension.

13. The device of claim 12 wherein the first array dimension corresponds to rows of the array and the second array dimension corresponds to columns of the array.

14. The device defined in claim 12 wherein the second line of logic regions is adjacent to the first line of logic regions.

15. The device defined in claim 12 wherein at least one of the PLC input signals applied to each programmable logic connector is transmitted via one of the second interconnection conductors such that this signal is substantially directly applied to the programmable logic connector from the output of a logic region of a third line of logic regions substantially aligned with the first array dimension.

16. The device defined in claim 15 wherein the third line of logic regions is adjacent to the first line of logic regions.

17. The device defined in claim 12 further comprising:
a driver associated with each programmable logic connector and configured to strengthen the signal that the programmable logic connector applies to the associated first interconnection conductor.

18. The device defined in claim 12 wherein each logic region comprises a plurality of sub-regions that are each configured to provide an output signal to the second interconnection conductor that extends from that sub-region.

19. A digital processing system comprising:
processing circuitry;
a memory coupled to said processing circuitry; and
a programmable logic integrated circuit device as defined in claim 12 coupled to the processing circuitry and the memory.

* * * * *